United States Patent [19]

Han

[11] Patent Number: 5,900,349

[45] Date of Patent: May 4, 1999

[54] METHOD FOR FORMING FINE PATTERNS OF SEMICONDUCTOR DEVICE

[75] Inventor: Jin Su Han, Ichon, Rep. of Korea

[73] Assignee: Hyundai Electronics Industries Co., Ltd., Kyoungki-do, Rep. of Korea

[21] Appl. No.: 08/666,263

[22] Filed: Jun. 20, 1996

[30] Foreign Application Priority Data

Jun. 23, 1995 [KR] Rep. of Korea ....................... 95-17091

[51] Int. Cl.$^6$ ....................................................... G03C 5/00
[52] U.S. Cl. .................................................. 430/311; 430/5
[58] Field of Search .................................... 430/296, 942, 430/5, 311; 250/429.3

[56] References Cited

U.S. PATENT DOCUMENTS

| | | | |
|---|---|---|---|
| 5,008,553 | 4/1991 | Abe | 250/492.2 |
| 5,057,462 | 10/1991 | Eisenberg et al. | 437/229 |
| 5,214,291 | 5/1993 | Hirai et al. | 250/492.2 |
| 5,597,668 | 1/1997 | Nowak et al. | 430/5 |

*Primary Examiner*—Janet Baxter
*Assistant Examiner*—Rosemary Ashton
*Attorney, Agent, or Firm*—Nath & Associates; Gary M. Nath; Harold L. Novick

[57] ABSTRACT

There is disclosed a method for forming fine patterns in a semiconductor device, comprising the steps of: providing a silicon substrate; coating a pattern material on the surface of the silicon substrate to form a layout of pattern; additionally arranging a plurality of dummy patterns, each having a smaller size than the minimum size at which patterning is not permitting, on the surface of the silicon substrate including the area of said layout; preparing a reticle by use of the layout where said fine dummy patterns are arranged; and exposing the layout on the silicon substrate through said reticle to light, which enables the patterns to have as accurate a width as desired, irrespective of the pattern density, whereby the production yield of the semiconductor device can be greatly improved.

7 Claims, 4 Drawing Sheets

METHOD FOR FORMING FINE PATTERNS OF SEMICONDUCTOR DEVICE

BACKGROUND OF THE INVENTION

1. Field of the Invention

The present invention relates, in general, to a method for forming fine patterns of a semiconductor device and, more particularly, to the use of dummy patterns, each having a size at which patterning is not permitted, to minimize the loss of pattern attributed to the proximity effect.

2. Description of the Prior Art

High integration of semiconductor devices requires many patterns of various sizes within a limited area. At an exposure process for forming desired patterns on a silicon substrate, a proximity effect, which is attributed to the refraction, scattering and/or interference of the light, usually occurs depending on the pattern density.

This effect results in a significant disadvantage in the formation of patterns. That is, the proximity effect may cause the light masks (or reticles) to be nonuniformly distorted, thereby causing the patterns to be dissected.

In order to better understand the background of the present invention, a description will be provided of the difference in proximity effect according to the difference in pattern density in a conventional method, with reference to some drawings.

FIGS. 1 and 2 show the conventional processes of pattern formation, illustrating the proximity effect generated by the pattern density of mask patterns.

First, FIG. 1A shows a layout 2 with a desired shape at such pattern density so as to minimize the proximity effect.

Subsequently, as shown in FIG. 1B, the layout 2 is used to give a reticle which is, in turn, used as a mask when exposing the pattern material on the silicon substrate 1 to light, to form a pattern 3. In this case, since the width of the patterns is almost the same as that of the layout 2, it is recognized that there is little alteration in the width attributed to the proximity effect.

In contrast, FIG. 2A shows a layout 11 with a line shape having such a pattern so as to show a large proximity effect.

Thereafter, as shown in FIG. 2B, a reticle is formed by use of the layout 11 and is then used as a mask to form a pattern 12 when the pattern material on the silicon substrate is exposed to light. In this case, the width of the pattern 12 is made thin by the proximity effect.

Since the pattern having such a pattern density induces a large proximity effect, as mentioned above, a serious photo bias is shown in the conventional process of pattern formation, and it is difficult to form a desired pattern. In addition, even at the pattern density which causes the proximity effect, etch bias is largely induced by a loading effect, so that the photo bias is disadvantageously required to be reduced during the exposure process.

SUMMARY OF THE INVENTION

Therefore, it is an object of the present invention to overcome the above problems encountered in the prior art and to provide a method for forming fine patterns of a semiconductor device, which enables patterns to have an accurate width as desired, irrespective of the pattern density, whereby the production yield of the semiconductor device can be greatly improved.

Based on intensive and thorough research by the present inventors, the above object can be accomplished by a provision of a method for forming fine patterns of a semiconductor device, comprising the steps of: providing a layout with a pattern density which the proximity effect is largely generated; additionally disposing a plurality of dummy patterns over the layout, wherein each dummy pattern has a smaller size than the minimum size at which the patterning is not permitted; preparing a reticle by the layout additionally disposed the dummy patterns; and forming a pattern material layer on a silicon substrate; exposing portions of the pattern material layer which formed on the silicon substrate not covered by the reticle to light using the reticle.

BRIEF DESCRIPTION OF THE DRAWINGS

Other objects and aspects of the invention will become apparent from the following description of embodiments with reference to the accompanying drawings in which.

DETAILED DESCRIPTION OF THE INVENTION

Figure 1A:
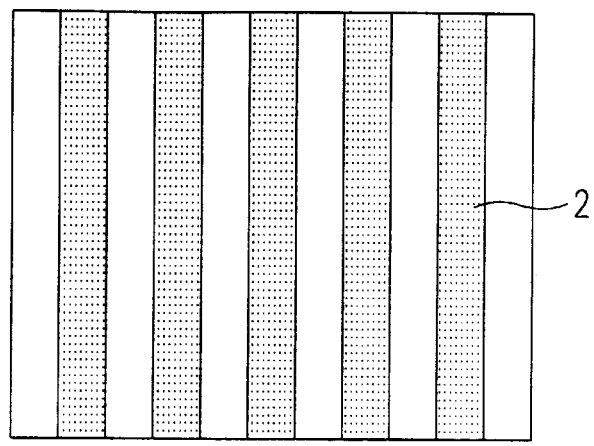
FIGS. 1 and 2 are views illustrating two conventional formation methods which are different in pattern density of mask pattern at an exposure step such that the proximity effect may occur.
Figure 1B:
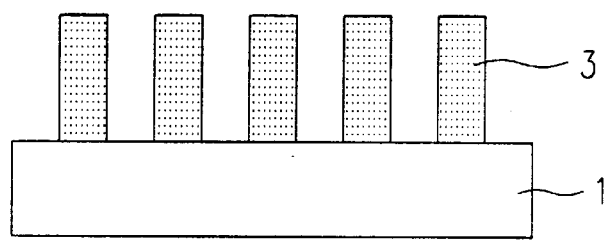
Figure 2A:
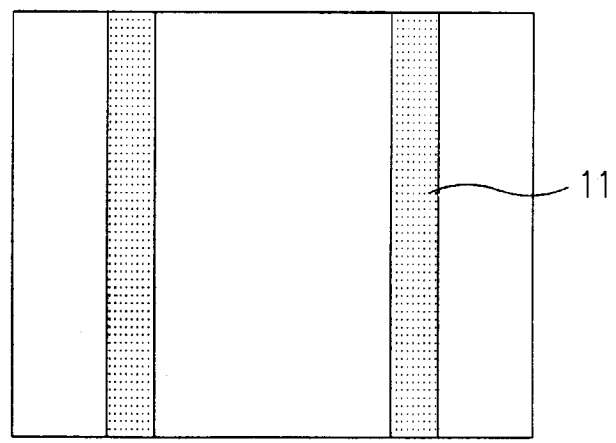
Figure 2B:
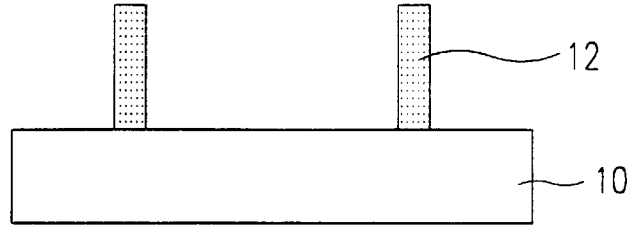

The application of the preferred embodiments of the present invention is best understood with reference to the accompanying drawings, wherein like reference numerals are used for like and corresponding parts, respectively.

FIG. 3 shows the processes of pattern formation according to a first embodiment of the present invention.

Figure 3A:
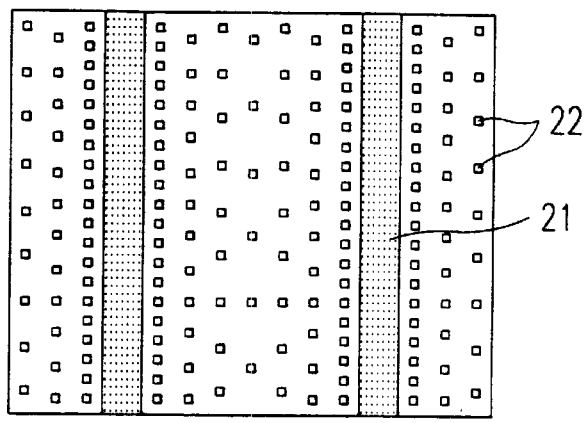
FIGS. 3A and 3B are views illustrating the formation method of patterns, according to a first embodiment of the present invention.

FIG. 3A shows a layout 21 with a pattern density on a silicon substrate 20, i.e. a line space at which the proximity effect is largely generated.

Subsequently, a plurality of dummy patterns 22 narrower than the critical point at which the patterning is not permitted are formed in such a manner that their density should become gradually lower as their locations are farther away from the proximity of the layout 21.

Figure 3B:
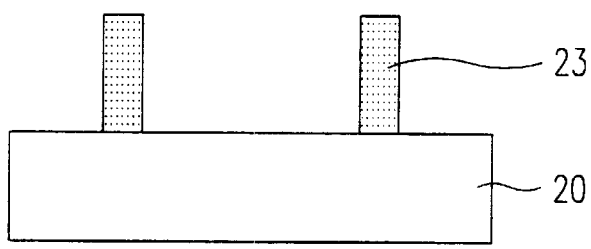

Thereafter, using the layout 21, a reticle is formed through which the pattern material is then exposed to light, to form a pattern 23, as shown in FIG. 3B.

At this moment, the pattern 23 obtained is not thinned by virtue of a higher density of the dummy patterns around the line space. Accordingly, the phenomenon of thinning line space caused by the proximity effect can be prevented and the line space can be patterned in as accurate a size as can be obtained.

Figure 4A:
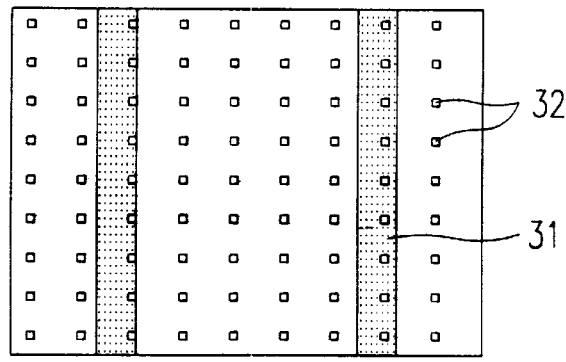
FIGS. 4A and 4B are views illustrating the formation method of patterns, according to a second embodiment of the present invention.
Figure 4B:
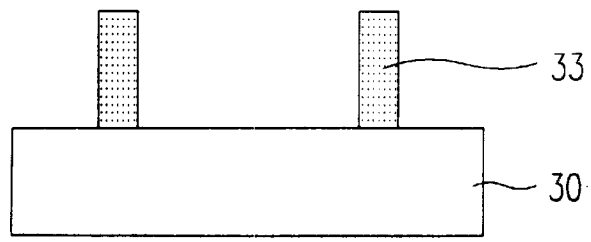

With reference to FIGS. 4A and 4B, there are shown processes of pattern formation according to a second embodiment of the present invention.

FIG. 4A shows a layout 31 with a pattern density on a silicon substrate 30, i.e. a line space at which the proximity effect is largely generated.

Subsequently, a plurality of dummy patterns 32 narrower than the critical point at which the patterning is not permitted, are formed in such a manner that their density should be equal, irrespective of the distance from the proximity of the layout 31, in contrast to those of FIG. 3A.

Thereafter, using the layout 31, a reticle is formed through which the pattern material is then exposed to light, to form a pattern 33, as shown in FIG. 4B.

As in the first embodiment, the phenomenon of thinning line space does not occur in this pattern 28 by virtue of the density of the dummy patterns around the line, so that the pattern can be obtained in as accurate a size as is desired.

Figure 5A:
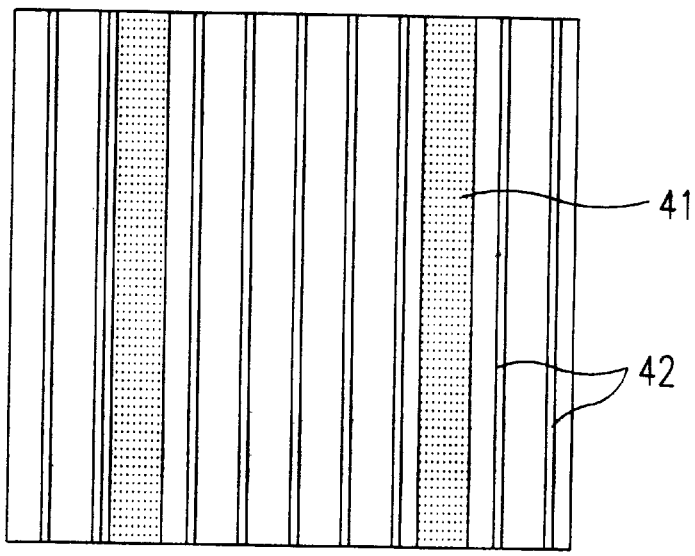
FIGS. 5A and 5B are views illustrating the formation method of patterns, according to a third embodiment of the present invention.
Figure 5B:
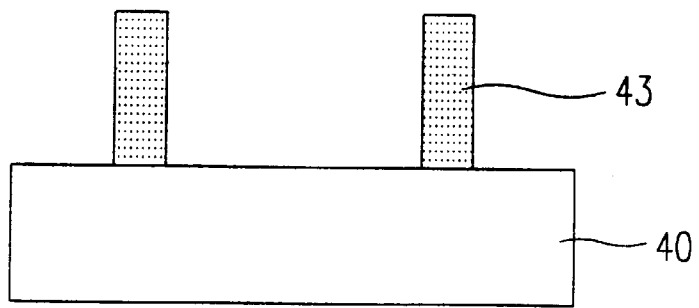

Referring to FIGS. 5A and 5B, there are shown processes of pattern formation according to a third embodiment of the present invention.

FIG. 5A shows a layout 41 with a pattern density on a silicon substrate 40, i.e. a line space at which the proximity effect is largely generated.

Subsequently, a plurality of line-like dummy patterns 42 narrower than the critical point at which the patterning is not permitted, are further arranged between the patterns.

Thereafter, using the layout 41, a reticle is formed through which the pattern material is then exposed to light, to form a pattern 43, as shown in FIG. 5B.

As in the above embodiments, the phenomenon of thinning line space does not occur in this pattern by virtue of the density of the dummy patterns around the line, so that the pattern can be obtained in as accurate a size as is desired.

Figure 6A:
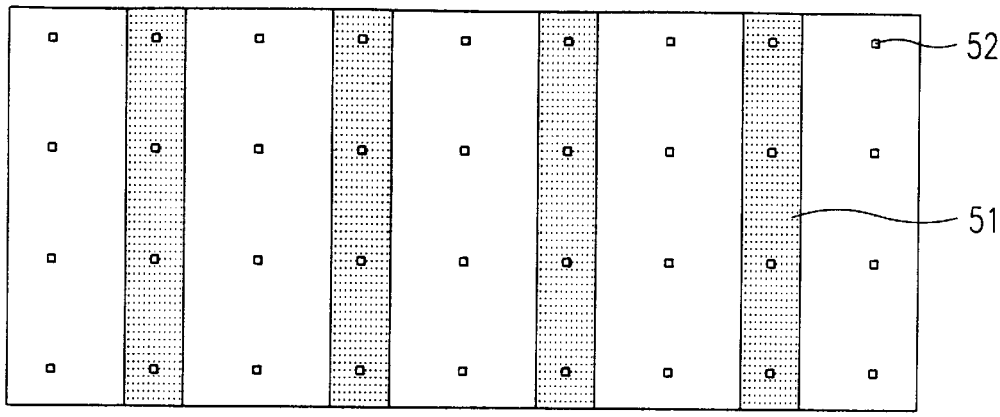
FIGS. 6A to 6C are views illustrating the formation method of patterns in which the first, second and third embodiments are applied.
Figure 6B:
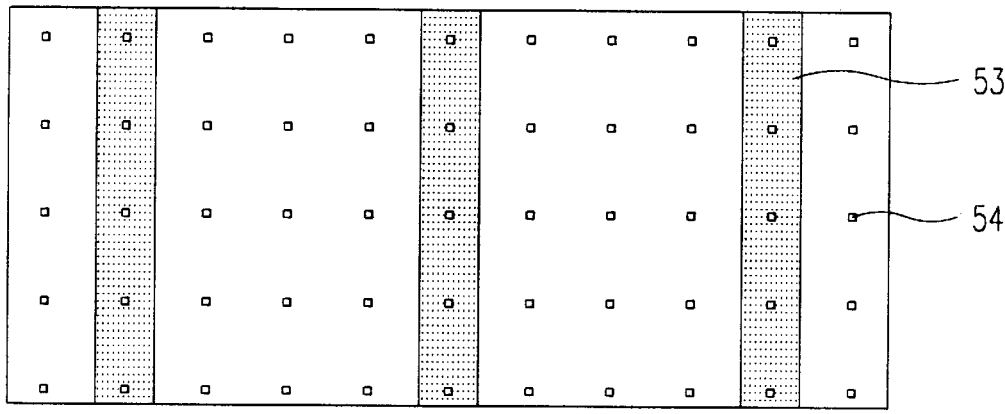
Figure 6C:
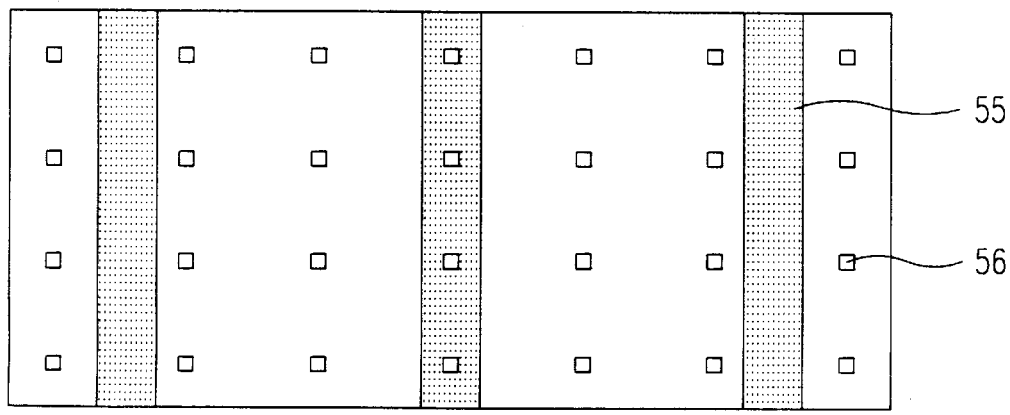

FIGS. 6A to 6C illustrate the application of the methods described in the above embodiments for the prevention of the proximity effect.

First, as shown in FIG. 6A, a plurality of point-like dummy patterns 52 which are narrower than the critical point at which the patterning is not permitted, are further arranged on the surface of the substrate 50 including the area of the layout 51 with a certain pattern density at which the proximity occurs. By exposing the substrate to light, patterns (not shown) are formed.

In FIG. 6B, on a layout 53 exhibiting a larger proximity effect than that of FIG. 6A, that is, having less pattern density, a plurality of dummy patterns 54 which are narrower than the critical point at which the patterning is not permitted, are formed at higher densities than in FIG. 6A, and subjected to layout. In addition, exposure to light forms patterns (not shown).

In FIG. 6C, on a layout 55 with a pattern density showing a proximity effect as large as that of FIG. 6B, a plurality of dummy patterns 56 which are larger than those of FIG. 6B and is narrower in size than the critical point at which the patterning is not permitted, are formed at lower densities than in FIG. 6B, and subjected to layout. Due to exposure to light, patterns (not shown) are formed.

In forming the layout with the aim of obtaining the effect of pattern density, this effect may be automatically accomplished. For example, where the above layouts are each difficult to arrange corresponding to the pattern density, layout tool software or reticle formation software may be provided with a function to control the pattern density by further arranging fine dummy patterns thereat.

The advantages obtained by the method for forming fine patterns of a semiconductor device according to the present invention are discussed below.

As described hereinbefore, dummy patterns with a size at which the patterning is impossible are further arranged in accordance with the present invention, to obtain the pattern density effect, thereby preventing the proximity effect of the conventional method, that is, preventing the pattern from being formed as desirable. Thus, the loss of pattern caused at a photo step by the proximity effect may be minimized in accordance with the present invention. Consequently, the method for forming fine patterns in a semiconductor device according to the present invention allows the same proximity effect irrespective of the pattern density, thus enabling the line to be formed as wide as desired. Therefore, the features of the fabricated semiconductor device are forecastable, thus enabling a great improvement in the production yield.

Other features, advantages and embodiments of the invention disclosed herein will be readily apparent to those exercising ordinary skill after reading the foregoing disclosures. In this regard, while specific embodiments of the invention have been described in considerable detail, variations and modifications of these embodiments can be effected without departing from the spirit and scope of the invention as described and claimed.

What is claimed is:

1. A method for forming fine patterns in a semiconductor device, comprising the steps of:

providing a layout with a pattern density which the proximity effect is largely generated;

additionally disposing a plurality of dummy patterns over the layout, wherein each dummy pattern has a smaller size than the minimum size at which the patterning is not permitted;

preparing a reticle by the layout with the additionally disposed dummy patterns;

forming a pattern material layer on a silicon substrate; and exposing portions of the pattern material layer which formed on the silicon substrate not covered by the reticle to light using the reticle.

2. A method in accordance with claim 1, wherein said dummy patterns are arranged in such a way that density of the dummy pattern gradually decreases farther from the position of the layout.

3. A method in accordance with claim 1, wherein said dummy patterns are arranged at a uniform density over the layout.

4. A method in accordance with claim 1, wherein each said dummy pattern is formed of a discrete deposition for which each dimension is smaller than a minimum size necessary for patterning a reticle.

5. A method in accordance with claim 1, wherein said dummy patterns are formed as lines, each of which is narrower than a minimum width necessary for patterning a reticle.

6. A method in accordance with claim 1, wherein said step of forming said dummy patterns is automatically carried out by a reticle preparation software used for forming said layout.

7. A method in accordance with claim 6, wherein said reticle preparation software is used to select the density of said dummy patterns.

* * * * *